United States Patent [19]

Takeno et al.

[11] Patent Number: 5,178,725
[45] Date of Patent: Jan. 12, 1993

[54] METHOD FOR WORKING CERAMIC MATERIAL

[75] Inventors: Shozui Takeno; Mari Yoshimura; Kohei Murakami; Masaharu Moriyasu, all of Hyogo, Japan

[73] Assignee: Mitsubishi Denki Kabushiki Kaisha, Tokyo, Japan

[21] Appl. No.: 673,652

[22] Filed: Mar. 21, 1991

[30] Foreign Application Priority Data

Apr. 4, 1990 [JP] Japan ................................. 2-91279
Apr. 4, 1990 [JP] Japan ................................. 2-91280

[51] Int. Cl.$^5$ .................... B44C 1/22; C03C 15/00; C03C 25/06
[52] U.S. Cl. ........................ 156/643; 156/645; 156/663; 219/121.17; 219/121.66
[58] Field of Search .............. 156/637, 638, 643, 645, 156/654, 657, 659.1, 663, 667; 219/121.16, 121.17, 121.65, 121.66, 121.35, 121.85; 252/79.2, 79.5

[56] References Cited

U.S. PATENT DOCUMENTS 5,022,957 6/1991 Copley et al. .................. 156/663 X

FOREIGN PATENT DOCUMENTS 63-190789 8/1988 Japan .
64-77506 3/1989 Japan .
2-38587 2/1990 Japan .

Primary Examiner—William A. Powell
Attorney, Agent, or Firm—Lowe, Price, Le Blanc & Becker

[57] ABSTRACT

A process is provided for working a base material which essentially consists of a ceramic material. The process includes an irradiation process of irradiating a laser beam or an electron beam to the base material in order to form an affected portion having cracks in the base material and a removing process for removing the affected portion. The ceramic material includes an oxide ceramic material (for example, alumina and forsterite) and a carbide ceramic material. The shape and the depth of the portion to be worked are controlled by the scanning of the laser beam or the electron beam. The removing process can include any one of the processes of vibrating the base material, applying a thermal shock to the base material and etching the base material. In accordance with the present invention, a base material which essentially consists of an oxide ceramic material or a carbide ceramic material can be worked with high aspect ratio and in a shorter period of time than in a conventional process.

22 Claims, 13 Drawing Sheets

METHOD FOR WORKING CERAMIC MATERIAL

BACKGROUND OF THE INVENTION

1. Field of the Invention

The invention relates to methods for working a ceramic material and, more particularly, relates to a method in which drilling, cutting, engraving and other working can be applied to a ceramic material used in an electronic substrate material, an electronic device and structural member and the like in an efficient, precise and minute manner.

2. Description of the Background Art

A ceramic material has a superior characteristic in that it has greater strength and hardness compared with general metals. Since the ceramic material shrinks by more than ten percents when formed by baking, a secondary working is essential to obtain parts formed by the ceramic material, having a high accuracy. This secondary working is, however, extremely difficult because of the great strength and hardness of the ceramic material.

Conventionally, grinding and ultrasonic machining and so on have been used in drilling, cutting and engraving of the ceramic material. When the ceramic material is worked with such a mechanical working, however, cracks tend to be caused in the ceramic material. Accordingly, it is difficult to work a ceramic material with high accuracy by such a mechanical working. Furthermore, the abovementioned methods entail a problem that a tool to be used is worn out and the efficiency of working is low.

Japanese Patent Laying-open No. 63-190789 by Ishii discloses a method in which the ceramic material is worked by photoetching. Referring to FIGS. 1A–1C, a method by photoetching will now be described below. In this method, firstly, as shown in FIG. 1A, a heat-and acid-resistant photoresist 2 is applied on the surface of a work piece 1. A desired work pattern is then transcribed on the resist by exposure, and an unnecessary portion is washed and removed to form a resist pattern 3 as shown in FIG. 1B. Subsequently, etching is effected with a phosphoric acid boiling at a high temperature (300° C.) to a desired depth to form grooves 4 as shown in FIG. 1C. After that, the resist is peeled with a remover.

In accordance with the method by photoetching, however, working is effected in a corrosive atmosphere at a high temperature, so that the resist is easily damaged during etching. The damage of the resist makes it easier to cause defects to the work piece. A cost is also increased for protecting the container for effecting etching from corrosion and damages. An operation of etching also involves dangers. Furthermore, there still remain problems as common to a general etching method, that working rate is low, that the efficiency of working is low, and that it is impossible to work until the aspect ratio (the depth of working/the width of working) is 1 or more.

On the other hand, a method of non-contact working with laser has been developed. Japanese Patent Laying-open No. 2-38587 by Morita and et al. discloses a working method using a working by laser and a wet etching. In this method, firstly, a melted-solidified layer is formed on a work piece by irradiation of a laser beam to the work piece. Next, the work piece is wet etched in an etchant having a high etching rate with respect to the melted-solidified layer. The melted-solidified layer is removed by etching.

Japanese Patent Laying-open No. 64-77506 by Takeuchi and et al. also discloses a working method in which laser and etching treatment is used. In this method, firstly, working such as drilling or cutting is applied to a work piece of a ceramic material by irradiation of a laser. The ceramic material is metallized in the worked portion. The metallized portion is then removed by etching.

These methods could only be applied to materials which are melted-solidified or metallized in the portion irradiated by a laser. The materials include metals (especially alloys) capable of being melted-solidified by a laser and a nitride ceramic material (for example, silicon nitride ($Si_3N_4$) and aluminum nitride (AlN) and the like) capable of being metallized by a laser, whereas they don't include an oxide ceramic material (for example, alumina) and a carbide ceramic material (for example, silicon carbide (SiC)) for which it is extremely difficult to be metallized. When oxide or carbide ceramic materials were worked by these methods, there was little difference between the portion irradiated by a laser and the portion which was not irradiated with respect to a characteristic resisting the etchant. Accordingly, it was very difficult to selectively apply etching only to the portion which had been irradiated by the laser. Additionally, a minimum size to be worked could not be made smaller than the normal size to be worked by a laser in a method in which etching is effected after the work piece is cut or drilled by a laser.

SUMMARY OF THE INVENTION

An object of the invention is to provide a method in which a base material essentially including an oxide ceramic material or a carbide ceramic material can be worked with a high aspect ratio (for example, 1 or more) in a shorter period of time than conventional ones.

Another object of the invention is to provide a method in which a fine working of ceramic materials can be performed efficiently.

Yet another object of the invention is to provide a method in which a base material can be worked without doing damage to the surface of the base material essentially including a ceramic material.

In accordance with the present invention, there is provided a process of working a base material essentially including a ceramic material. The process includes an irradiation process for irradiating an energy beam on the base material to form an affected portion having a cracking in the base material and a removing process for removing the affected portion. By irradiating an energy beam to a base material essentially including a ceramic material which is chemically stable and superior in corrosion-resistant characteristic, the portion of the base material irradiated by the beam is heated and melted. Cracks are formed in the portion irradiated by the beam after the irradiation of the energy beam. Furthermore, it is supposed that the composition of the irradiated portion can be changed (for example, in the case of an oxide ceramic material, the content of oxygen is decreased). As a result, the portion irradiated by the beam, i.e., the affected portion has cracks and has a characteristic different from that of the portion which was not irradiated, i.e., the base material. Since the cracks act to separate the affected portion and the base material, the affected portion is removed by utilizing the cracks in the following removing process. Additionally, removing of the affected portion can be further promoted in the removing process by utilizing the difference of the characteristics between the affected portion and the base material, for example, the difference of solubility in a certain solution.

The base material to be worked essentially includes a ceramic material, and the ceramic material includes an oxide ceramic material, a carbide ceramic material, a nitride ceramic material and other inorganic solid materials. Particularly, the present invention can be effectively applied to working of an oxide ceramic material and a carbide ceramic material. An oxide ceramic material, for example, includes alumina, zirconia, forsterite and other metal oxides. A carbide ceramic material includes silicon carbide, boron carbide and other metal carbides.

The energy beam irradiated to the base material in accordance with the present invention includes a laser beam, an electron beam, an ion beam and other beams in which energy is concentrated. The laser beam and the electron beam are more preferably used. The energy beam can be irradiated on a predetermined location of the base material. The base material can be worked into various shapes by scanning the energy beam. The shape, the depth and the width of the portion worked by the energy beam can be controlled by controlling at least one of the output of the energy beam, the scanning rate, the scanning pitch and the number of scanning.

The removing process for removing the portion on the base material which has been irradiated and affected by the energy beam may include various processes. In one manner, the removing process may include a process of removing the affected portion by vibrating the base material to expand and extend the cracks. The cracks formed in the base material by the irradiation of the energy beam are expanded and extended by the vibration. As the vibration is continued, the cracks are linked together to cause the affected portion to be separated from the base material. Consequently, the affected portion is completely separated from the base material by the vibration. While the manner of the vibration is not particularly limited, ultrasonic vibration may be used as a preferable form of vibration.

In another manner, the removing process may include a process of removing the affected portion by applying a thermal shock to the base material to expand and extend the cracks. The thermal shock can be generated, for example, by cooling the base material immediately after heating it. The larger the difference between the heating temperature and the cooling temperature is, the larger the thermal shock becomes. The difference of temperature can be set to an appropriate value in a range in which the base material itself is not destroyed. The cracks formed in the affected portion having an expansion coefficient different from that of the base material are expanded and extended because of the sudden shrink or expansion of the base material by the thermal shock. Consequently, the expanded and extended cracks cause the affected portion to be separated from the base material.

In still another manner, the removing process may include a process of removing the affected portion by etching the base material. Etching can be performed, for example, by soaking the base material in an etchant. The etchant may include an aqueous solution of phosphoric acid, hydrochloric acid or sulfuric acid and an aqueous solution of potassium hydroxide or sodium hydroxide. After the base material is soaked in the etchant, the etchant permeates to the inside of the affected portion through the cracks formed in the affected portion. The etchant erodes the affected portion and makes the cracks expanded and extended. Consequently, the affected portion is removed from the base material by etching. When the base material essentially includes an oxide ceramic material, it is supposed that the content of oxygen in the affected portion has been reduced. The change in composition makes it easier for the affected portion to be eroded by the etchant compared with the base material. The affected portion is quickly separated from the base material by the expansion and extension of the cracks due to the change in composition in the etching process.

Furthermore, the removing process may also include a process of etching the base material, vibrating it at the same time. In this case, the base material is etched with the cracks in the affected portion being extended and expanded by vibration, so that the affected portion can be removed efficiently and in a shorter period of time. Additionally, the removing process may also include a process of etching the affected portion in which the cracks are extended and expanded by a thermal shock and/or vibration. The extended and expanded cracks promote the removal of the affected portion by etching.

The base material applied in the irradiation process in accordance with the present invention may be a base material on which a resist film is formed. A synthetic resin film, for example, is used as the resist film. When the energy beam is irradiated on the resist film, the resist film irradiated by the beam is removed (that is, patterning is effected), and a portion of the base material under the removed resist film is affected by the energy beam. Subsequently, the affected portion of the base material is removed, for example, by etching the base material. In this case, the portion of the base material which was not irradiated by the beam is protected with the resist film, so that the base material is prevented from being damaged in a removing process such as etching. Additionally, when etching is used in the removing process, a highly erosive etchant may be used. In this way, a time period required for etching can be shortened.

In accordance with the present invention, an affected portion having cracks is formed in a base material by irradiating an energy beam on the base material essentially including a ceramic material. The affected portion having cracks can be easily formed even in an oxide ceramic material and a carbide ceramic material for which it is extremely difficult to be metallized. This affected portion can be removed by the various methods described above. Accordingly, in accordance with the present invention, a base material essentially including an oxide ceramic material or a carbide ceramic material can be worked. Additionally, if conditions of irradiation of an energy beam are controlled, the shape, the depth and the width of the affected portion can be changed. Then, if the affected portion is removed, worked portions having various shapes, depths and widths can be formed in the base material. Therefore, if the affected portion is removed after the irradiation by the energy beam under an appropriate condition, the worked portions can have a high aspect ratio (for example, 1 or more).

Since the size of the affected portion having cracks can be made smaller than the size obtained by the conventional laser working, finer working than conventional ones can be applied to the base material. Furthermore, forming affected portions having cracks which can turn into holes or grooves by an energy beam makes it possible to form the holes or the grooves in a shorter period of time than when the holes or the grooves themselves are formed in the base material by the energy beam. When a process of removing the affected portion by etching is employed, the working can be conducted in a shorter period of time compared with the conventional process including laser working and etching.

As stated above, if the resist film is formed on the surface of the base material, the base material can be worked without doing any damage to portions other than the portion to be worked on the surface of the base material.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
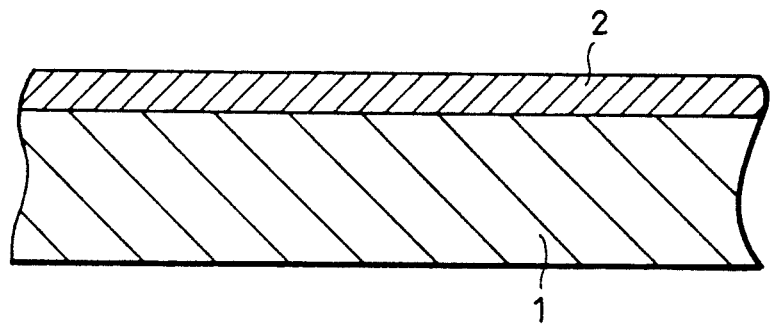
FIGS. 1A-1C are sectional views showing a process of a method in which a ceramic material is worked using a conventional photoetching.
Figure 1B:
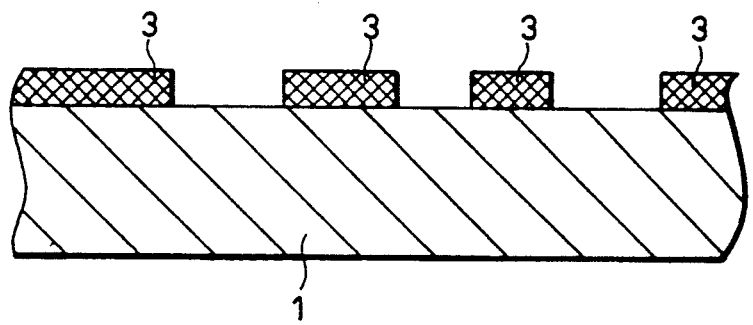
Figure 1C:
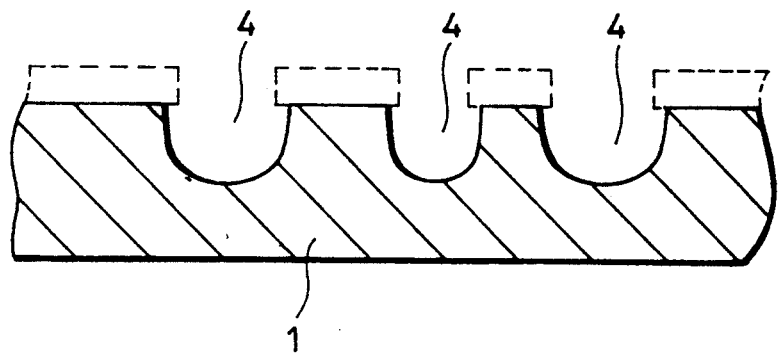
Figure 2:
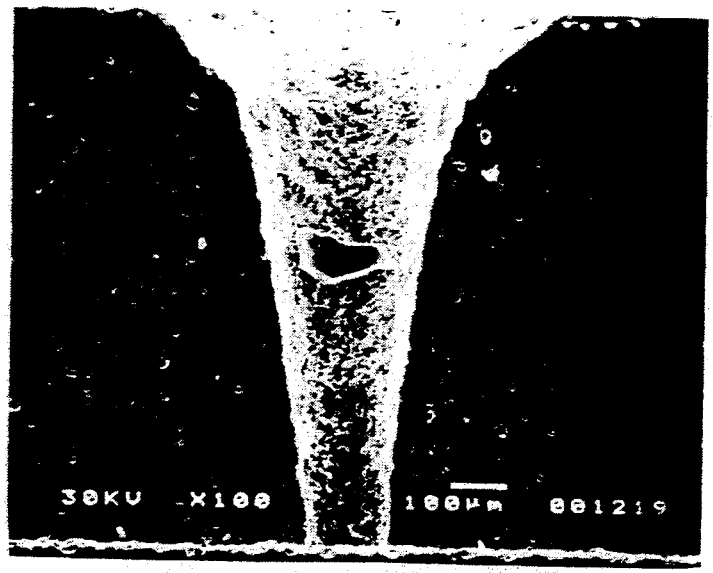
FIG. 2 is a sectional view of a base material including forsterite having holes made in a first embodiment in accordance with the present invention.

As a first embodiment in accordance with the present invention, there is, in the following, described a case in which a base material including an oxide ceramic material complex, forsterite ($2MgO.SiO_2$) is drilled. An electron beam is used in drilling. The condition of the electron beam is as follows. Acceleration voltage: 60 kV, beam current: 40 mA, pulse width: 200 $\mu s$. After irradiation of the electron beam, the base material is provided with an ultrasonic vibration of 47 kHz in ethylalcohol for 20 minutes. FIG. 2 shows the cross section of the base material when drilling is completed. In this way, the application of the ultrasonic vibration to the base material can remove the portion irradiated by the beam light.

In a second embodiment of the invention, a case is described in the following in which a base material including an oxide ceramic material, zirconia ($ZrO_2$) is subjected to working. The base material is worked by a YAG laser. The condition of the laser is as follows. Peak output: 2.4 kW, pulse width: 200 $\mu s$. The base material is drilled by the laser and then soaked in the water of 90° C. for 3 minutes. Then, the base material is put in liquid nitrogen of $-70°$ C., and a thermal shock is applied to it. Since the temperature difference in which zirconia can resist against a thermal shock is 200° C., the thermal shock is applied in the temperature difference of 200° C. or below. This process of the thermal shock is repeated about 5 cycles, so that the portion irradiated by the laser can be removed.

In a working method as stated above, when an appropriate thermal shock or vibration is applied to a worked material which has been worked by an energy beam such as a laser beam and an electron beam, microcracks which have been formed are extended and expanded on the border between the portion irradiated by the beam and the portion which was not irradiated. As the microcracks are extended and expanded, the portion affected by the beam is efficiently removed in a comparatively short period of time.

Figure 3:
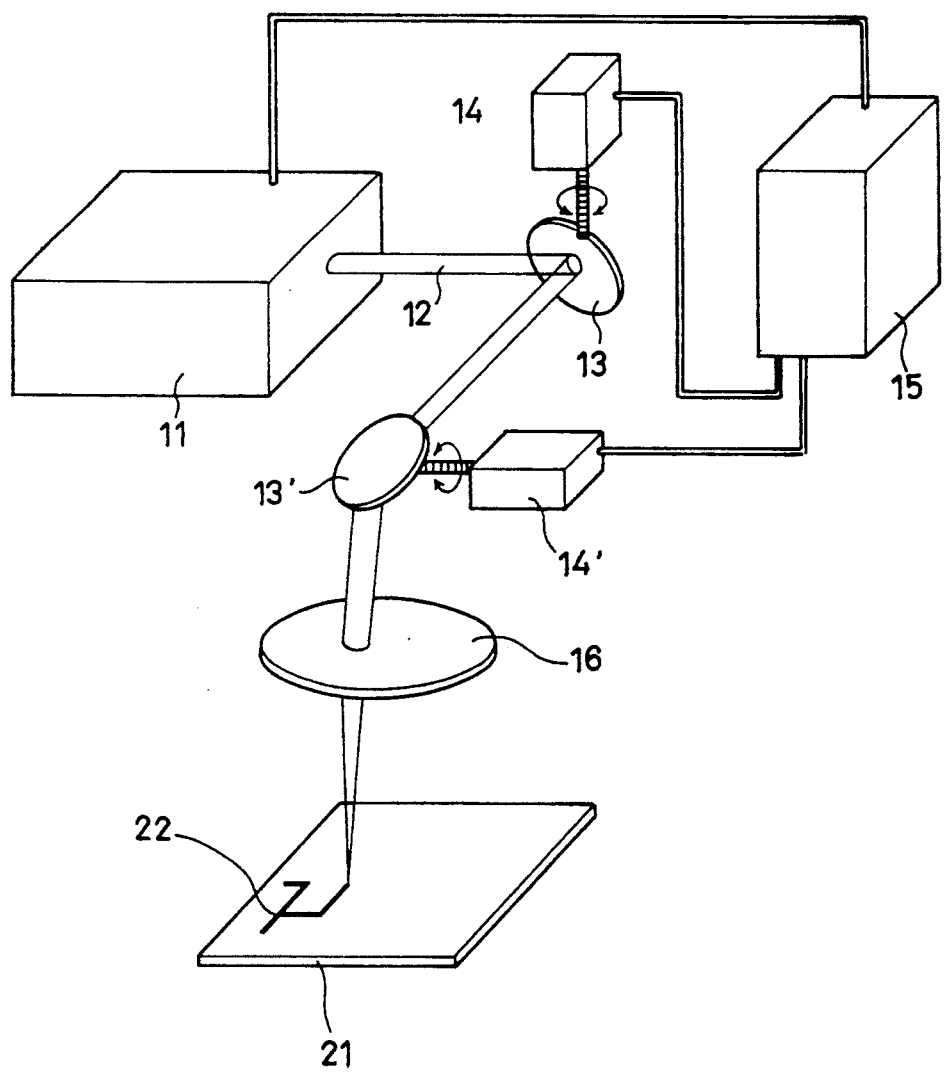
FIG. 3 is a diagram showing a laser beam being irradiated on a base material including an alumina ceramic material ($Al_2O_3$) in a third embodiment of the present invention.

As shown in FIG. 3, a third embodiment is described in the following, in which a base metal essentially including an alumina ceramic material ($Al_2O_3$) is worked using a $CO_2$ laser to effect engraving.

Referring to FIG. 3, the laser beam supplied from a $CO_2$ laser oscillator 11 is guided to a desired position by reflecting mirrors 13 and 13'. The reflecting mirrors 13 and 13' are driven by drive mechanisms 14 and 14'. The $CO_2$ laser oscillator 11 and the drive mechanisms 14 and 14' are controlled by a system control device 15. The laser beam 12 guided to the desired position is focused on a work piece 21 of an alumina ceramic material by a condensing lens 16. An affected portion 22 is formed on the work piece 21 by the irradiation of the laser. The operation of the drive mechanisms 14 and 14' by the system control device 15 sets the irradiation position of the laser beam on the work piece 21. The $CO_2$ laser oscillator 11 is also controlled by the system control device 15 with respect to the output of the laser and a pulse condition. The irradiation position and the condition of the laser irradiation are controlled based on a program input in advance in the system device 15.

Figure 4:
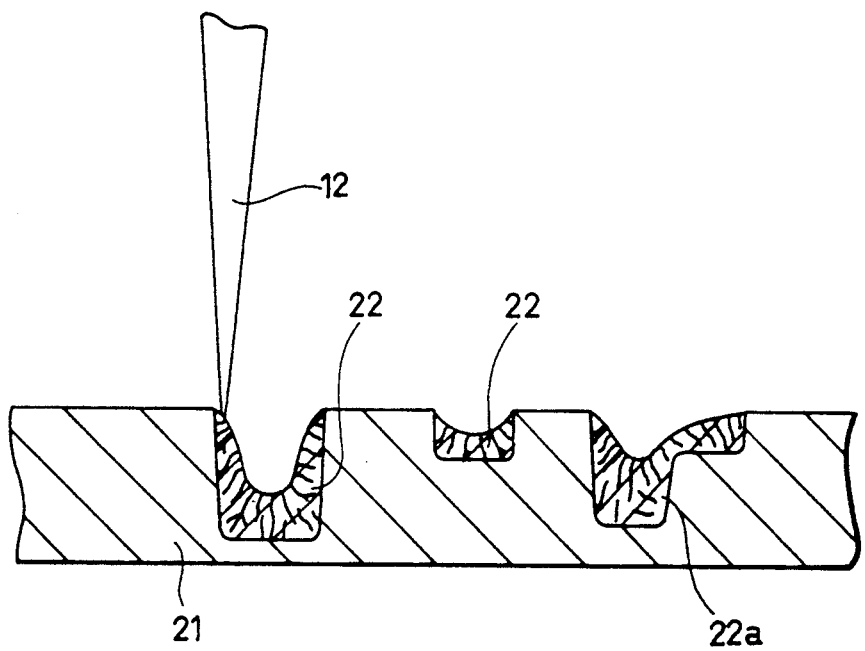
FIG. 4 is a sectional view of the base material having the laser beam irradiated thereon to form affected portions in the third embodiment.

The portion on the work piece 21 irradiated by the laser is melted and affected by the heat. As shown in FIG. 4, the affected portion 22 has a multiplicity of minute cracks. In addition, it is assumed that the composition of the affected portion 22 has been changed (for example, the content of the oxygen is reduced). The affected portion 22 can be formed with any width and depth by adjusting the conditions of laser irradiation and scanning. Therefore, an affected portion 22a can also be formed, which can turn into terraced grooves. For example, a laser is irradiated under the condition of laser output 100 W, laser scanning rate 1 m/min, scanning pitch 100 μm, grooves having a depth of about 1 mm can be obtained. The width of the grooves in this case may be obtained in accordance with the equation: scanning pitch (100 μm) × the number of scanning + beam diameter (about 200 μm).

Figure 5:
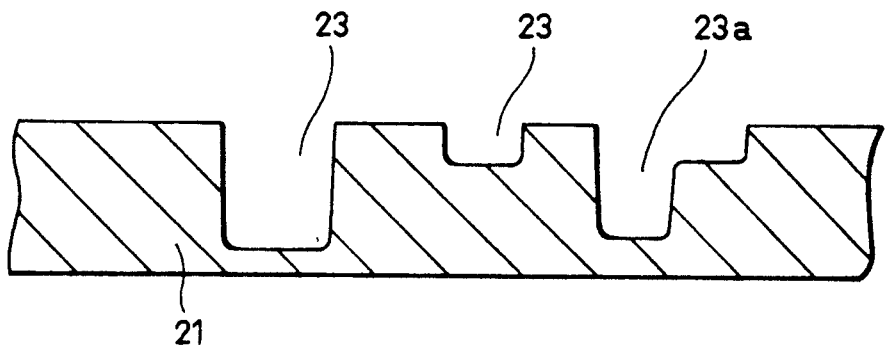
FIG. 5 is a sectional view after the base material shown in FIG. 4 has been etched.

Subsequently, after a desired shape and pattern of the affected portion 22 has been formed, the work piece 21 is etched in an acid aqueous solution which has been heated to a predetermined temperature and activated. For example, the work piece 21 is etched in an aqueous solution of phosphoric acid having a concentration of 85% at 180°-200° C. for about 1 hour. While the base material of the work piece 21 is not etched by such an etchant, the etchant permeates in the cracks of the affected portion 22 and efficiently removes only the affected portion 22. As shown in FIG. 5, grooves 23 and 23a each having a desired shape and pattern can be formed.

Irradiation of a laser beam or an electron beam on a ceramic material which is chemically stable and highly corrosion-resistant causes the portion on the ceramic material irradiated by the beam to be melted and have cracks. In addition, the composition of that portion is changed. As a result, the degree of corrosion-resistance against the etchant is reduced in the portion irradiated by the beam and the etchant starts permeating into that portion through the cracks. Therefore, etching can selectively remove only the melted portion under such a condition that the base material of the work piece may not be etched.

Figure 6A:
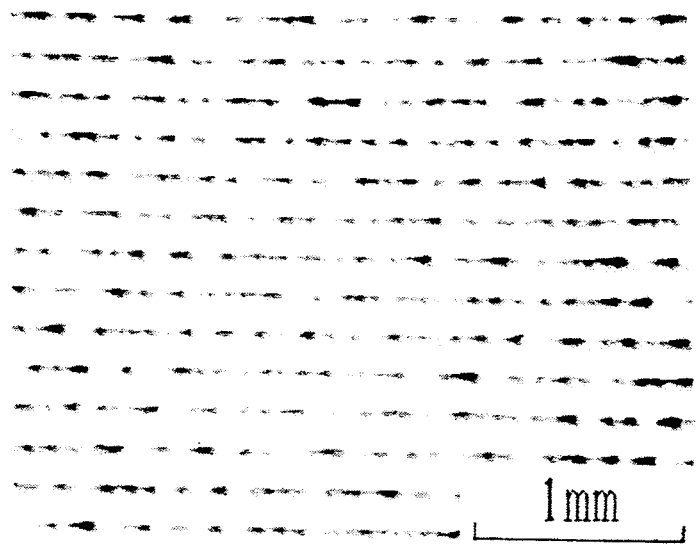
FIG. 6A is a diagram showing a number of melted materials being attached to the base material after irradiation by the laser beam in a fourth embodiment in accordance with the present invention.
Figure 6B:
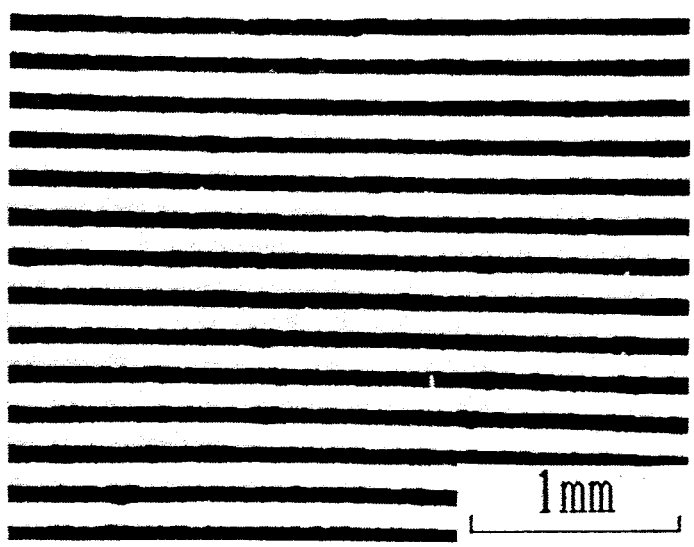
FIG. 6B is a diagram showing the melted materials having been completely removed from the base material after etching treatment in the fourth embodiment.

Making slits on an alumina ceramic material will now be described in the following as a fourth embodiment. When a slit is formed on a plate of an alumina ceramic material having a thickness of 0.25 mm with a $CO_2$ laser, conventionally, the alumina ceramic material was melted with the laser, and in order to eliminate melted material, the melted material was heated to as high a temperature as possible with the laser beam, for example, of output of about 20 W, 0.1 m/min to have a low viscosity. Such an irradiation of the beam reduced the attachment of the melted material by as much amount as possible. As a result, the effective beam diameter was increased and the width to which the heat is applied is widened, so that it was difficult to make the width of grooves to be formed below 200 μm. Conversely, there is no need to eliminate the melted material of the alumina ceramic material by the laser beam in the embodiment. An affected portion needs only to be formed until it reaches the other surface of the base material, so that the output 8 W, 0.1 m/min is enough for the condition of the beam. The base material is soaked in the etchant after the irradiation of the laser beam as in the third embodiment. Though such a reduction in the output of the beam causes attachment of a melted material to the worked portion, the width of grooves to be formed can be reduced to 90 μm, half of the conventional ones or below. Therefore, it will be possible to effect making slits having a pitch of 180 μm. As shown in FIG. 6A, while a large amount of melted material is attached to the base material after the laser irradiation, the melted material is completely removed after etching as shown in FIG. 6B.

Figure 7:
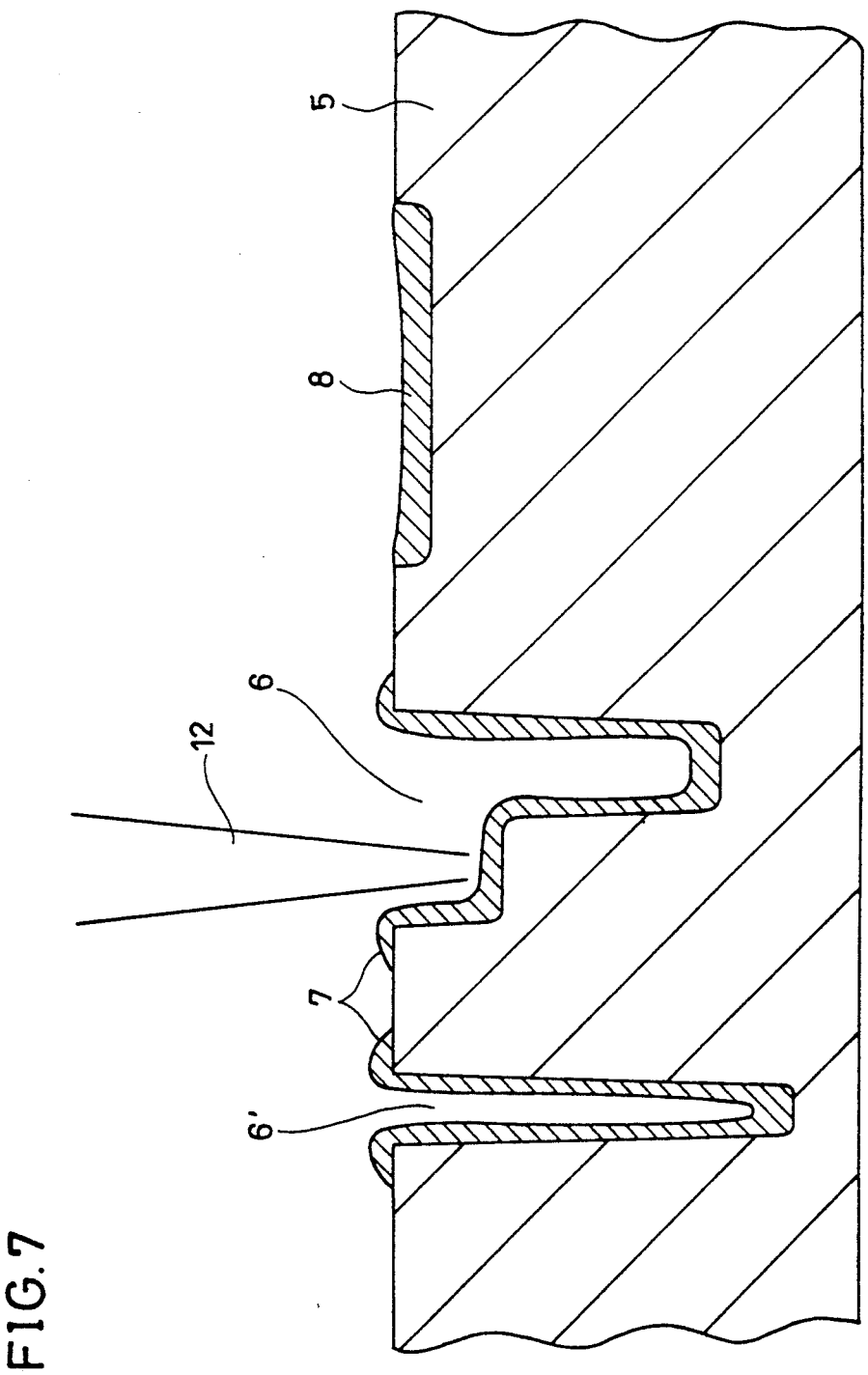
FIG. 7 is a sectional view of an alumina base material to which engraving has been applied by the laser beam in a fifth embodiment.

Engraving of alumina as a fifth embodiment in accordance with the present invention will be described in the following with reference to the drawings. FIG. 7 shows the cross section of the alumina base material to which engraving is applied by a laser. The alumina base material 5 has grooves 6 and 6' formed thereon by the laser beam 12. After working, an affected portion 7 by the heat of the beam is attached to the grooves 6 and 6'. Grooves need not necessarily be formed immediately after the laser irradiation, and as shown in the drawing, at least the portion irradiated by the laser should only have an affected portion 8 formed thereon by the heat.

Figure 8:
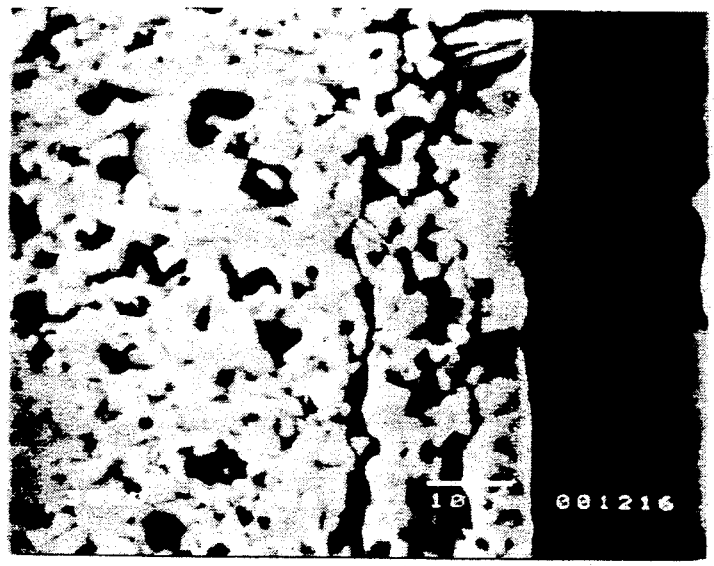
FIG. 8 is a picture of the affected portion obtained by a scanning electron microscope in the fifth embodiment.
Figure 9:
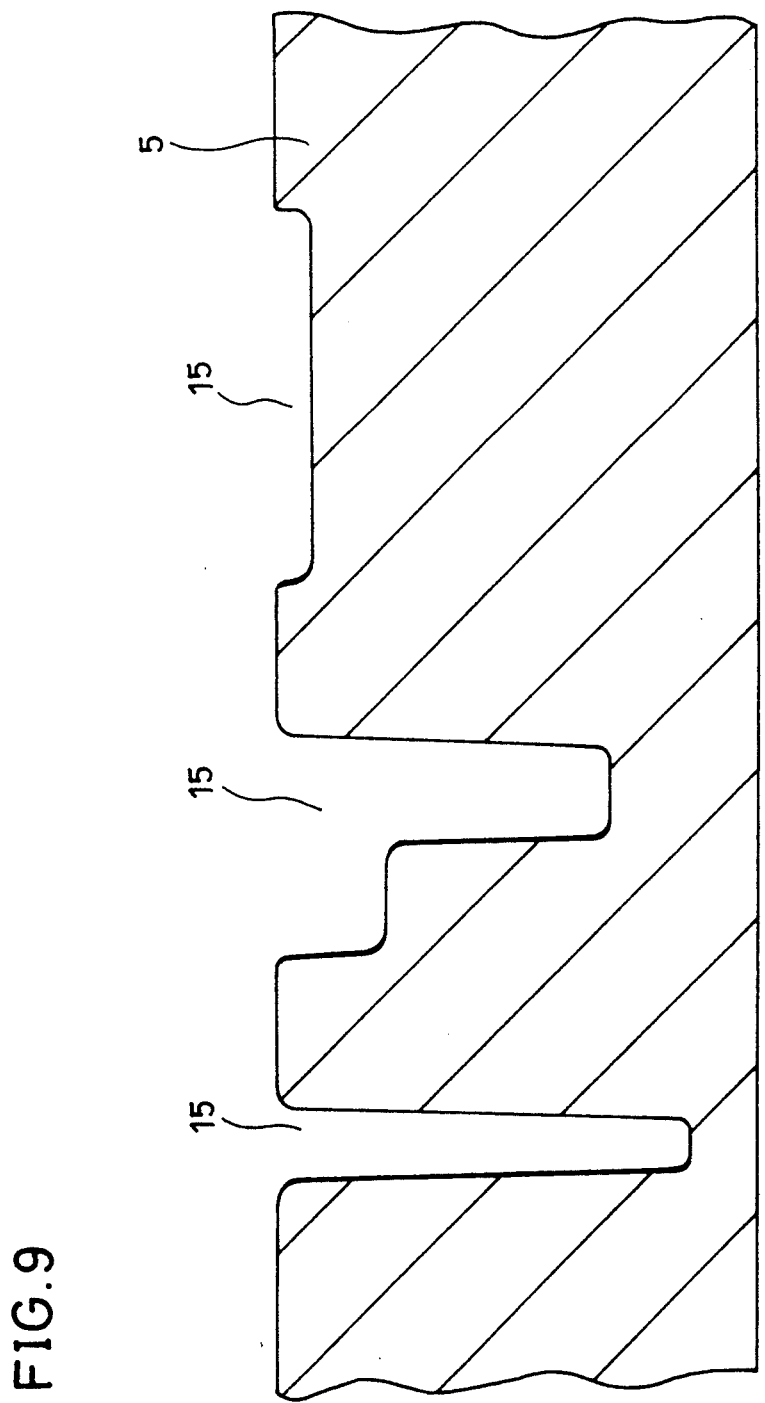
FIG. 9 is a sectional view showing the base material having a desired worked portion formed in the fifth embodiment.

FIG. 8 shows a view of the affected portion 7 obtained by the scanning electron microscope. It is shown that a multiplicity of microcracks exist in the affected portion 7. The base material 5 at a room temperature is put in an etchant at an high temperature and a thermal shock is applied to it. The etchant has such a concentration and temperature that the base material 5 may not be corroded. While etching is being conducted, the base material is sometimes (for example, about every 10 minutes) put into a water of a room temperature to over 10° C. from the etchant and the thermal shock is applied to it. The affected portions 7 and 8 of the base material 5 are selectively corroded in the etchant. In addison, the microcracks in the affected portions 7 and 8 develop and parts of the affected portions 7 and 8 are peeled from the base material 5. By repeating such a process, as shown in FIG. 9, a desired worked portion 15 without any cracks and affected portions can be obtained with high accuracy in a considerably shorter period of time (about 30 minutes) than the time required for the conventional photoetching method (1 hour or more).

The treatment condition in the case of the above-mentioned fifth embodiment was determined as follows. Since the maximum of the temperature difference at which the alumina can resist against a thermal shock is 180° C., there is a possibility that the base material will be destroyed if a thermal shock with a temperature difference of above 180° C. The etchant used in the fifth embodiment, the aqueous solution of phosphoric acid of 85% starts to corrode the above-mentioned affected portion of the alumina at 120° C. and starts to do damage to the base material at 250° C. or above. From the foregoing, 180° C. of the temperature for etching, 50° C. of the temperature of the water for a thermal shock and 30 minutes for working time were employed. A thermal shock involving ultrasonic vibration into the etchant effectively promotes the affected portion being peeled from the work piece. While it is preferable that a thermal shock is applied to the work piece a plurality of times, only one thermal shock is effective and fully practical.

Figure 10:
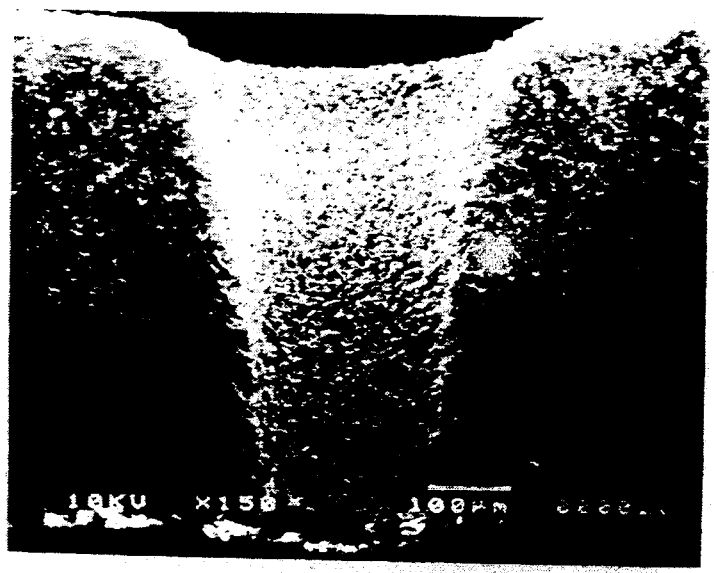
FIG. 10 is a diagram showing the cross section of a base material including alumina having holes made in a sixth embodiment.

FIG. 10 is a diagram showing the cross section when the present invention is applied to drilling of alumina as a sixth embodiment. In the sixth embodiment, as in the fifth embodiment, the base material is etched in an aqueous solution of phosphoric acid of 85% at a temperature of 180° C. in a working period of 30 minutes after the base material of alumina has been worked by the laser beam. An ultrasonic vibration of 47 kHz is applied to the etchant. The affected portion is thereby peeled. As shown in FIG. 10, the inner wall of the worked hole has no crack and no affected portion.

In this way, such etching that the base material may not be damaged is effected, applying a thermal shock and/or a vibration. It has become easier for the affected portion to be etched in some degree compared with the base material due to the change in the composition (for example, the content of the oxygen is reduced), so that the etchant which has permeated inside through the cracks formed in the affected portion selectively etches the affected portion in the periphery of the cracks. The microcracks present on the border between the affected portion and the base material grow, and the affected layer and the base material are completely separated by repeating a thermal shock and/or a vibration-etching. As a result, the affected layer is removed efficiently and precisely without doing damage to the surface of the base material.

Even if such a condition for etching is set that the base material would be hardly damaged, the base material, in some cases, becomes out of use due to a small damage such as removal of a binder component on the surface of the base material. In addition, there is a need for improving a throughput, effecting working in a shorter period of time. From these points of view, a seventh embodiment is conducted in accordance with the present invention.

Figure 11:
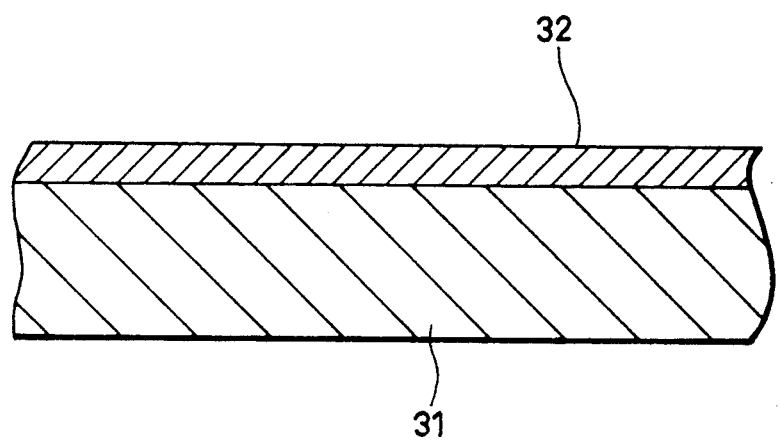
FIG. 11 is a sectional view showing the surface of a base material including an alumina ceramic material having a resist film formed thereon in a seventh embodiment of the present invention.

The seventh embodiment is described in the following with reference to the drawings. Firstly, as shown in FIG. 11, a resist is applied to the surface of a base material 31 of an alumina ceramic material as a work piece by a spin coat or a roll coat or the like. Then, a film 32 of polybutadiene negative type resist with a thickness of 5 μm (CBR-M901 made by Nippon Gomu Kabushiki Kaisha) is uniformly formed on the base material 31 via processes of prebake, exposure, development, rinsing and postbake and so on.

Figure 12:
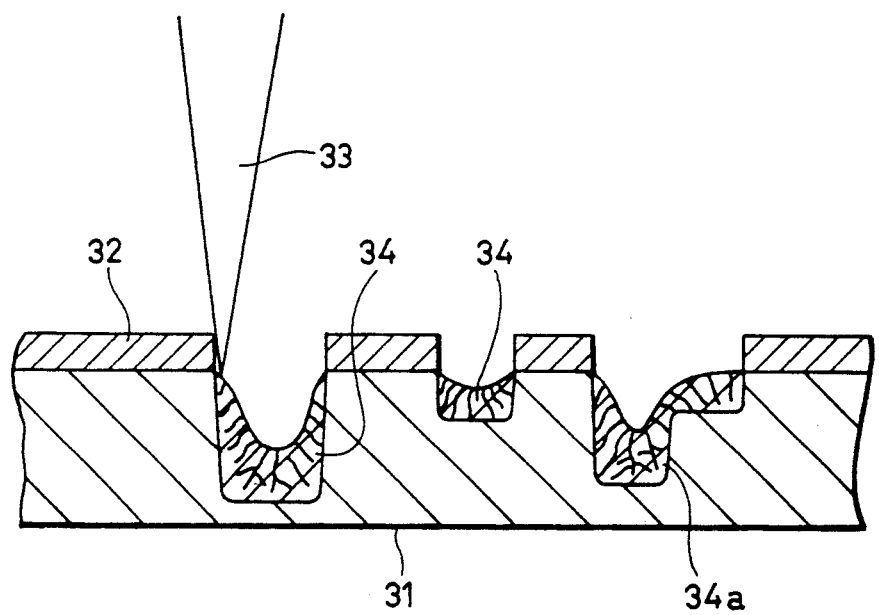
FIG. 12 is a sectional view showing a laser beam being irradiated on a desired portion on the resist film shown in FIG. 11.

As shown in FIG. 12, a $CO_2$ laser beam 33 is focused on a desired portion on the resist film 32. A resist pattern is formed in the resist film 32 as a result of the portion irradiated by the beam being removed. Affected portions 34, 34a affected by the heat of the laser beam 33 are formed on the portion of the base material 31 in which the resist has been removed at the same time of the formation of this resist pattern. These affected portions 34, 34a have a multiplicity of minute cracks as in the affected portions 22, 22a in the third embodiment.

Figure 13:
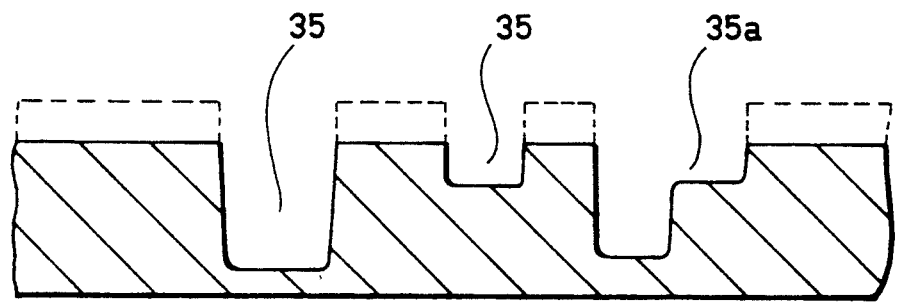
FIG. 13 is a sectional view showing the base material finally having grooves formed in the seventh embodiment.

After that, etching similar to that in the third embodiment is applied to the base material 31. For example, similarly to the third embodiment in which the resist film 32 is not used, when etching of the base material is effected in the solution of 85%$H_3PO_4$ at 180°-200° C. for 1 hour, the affected portions 34, 34a are completely removed. Then, a work piece having grooves 35 and 35a as shown in FIG. 13 can be obtained by removing the resist film 32. In this case, the surface of the base material 31 is protected with the resist film 32 during the process of etching, so that, consequently, the work piece having no damaged surface can be obtained. In addition, the resist film 31 makes it possible to etch the base material under such a condition that the base material 31 would be damaged naturally, for example, in the solution of 85%$H_3PO_4$ at 260°-280° C. This etching completely removes the affected portions 34, 34a in 30 minutes. The period 30 minutes is equivalent to half the time required when the resist film 32 is not used.

The resist film used in the seventh embodiment need not necessarily have a characteristic that it hardens by exposure such as a normal photoetching. Additionally, a condition softer than that of photoetching can be employed. Accordingly, resist films in a wider range can be applied.

Figure 14:
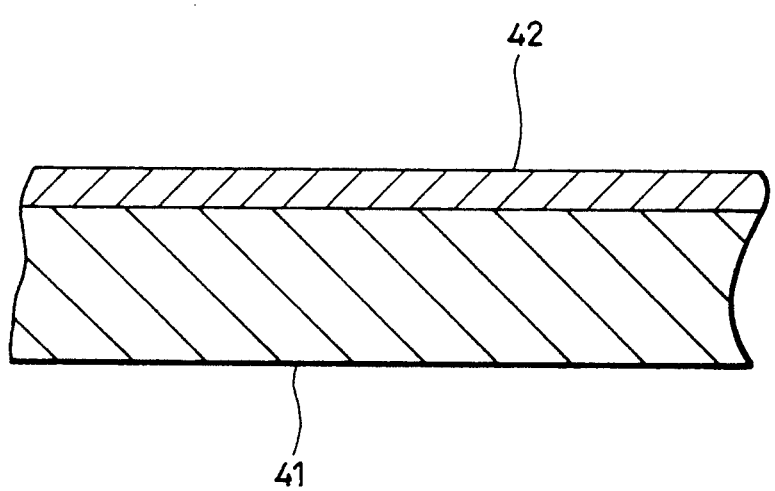
FIG. 14 is a sectional view of a base material including a ceramic material having a resist film formed thereon in a eighth embodiment.

An eighth embodiment will now be described in order of the processes. In the eighth embodiment, alumina is used as a base material essentially including a ceramic material. Firstly, as shown in FIG. 14, a resist is applied on the surface of a base material 41 by a spin coat or a roll coat. A film 42 of polybutadiene negative type resist (CBR-M901 made by Nippon Gomu Kabushiki Kaisha) with a thickness of 5 μm is uniformly formed on the base material 41 via processes of prebake, exposure, development, rinsing and postbake.

Figure 15:
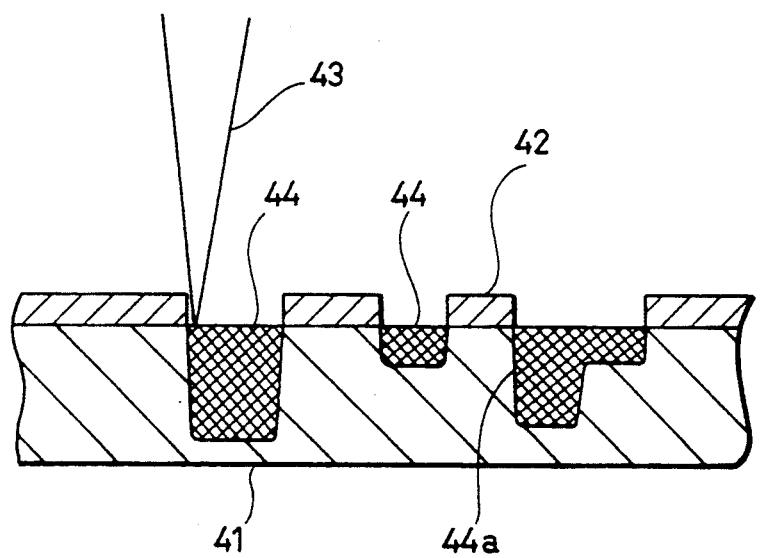
FIG. 15 is a sectional view of a base material having a resist pattern and a melted pattern formed thereon by beam irradiation in the eighth embodiment.

Then, as shown in FIG. 15, a $CO_2$ laser beam 43 concentrated at a power density of $10^4 W/cm^2$ or above is irradiated on a desired portion on the resist film 42. The irradiation of the laser beam removes the resist film 42 on the surface of the base material 41 and a resist pattern is formed. The portion of the resist pattern of the base material 41 is affected and/or decomposed by the laser beam simultaneously with the formation of the resist pattern. As a result, an affected portion 44 having microcracks is formed.

Figure 16:
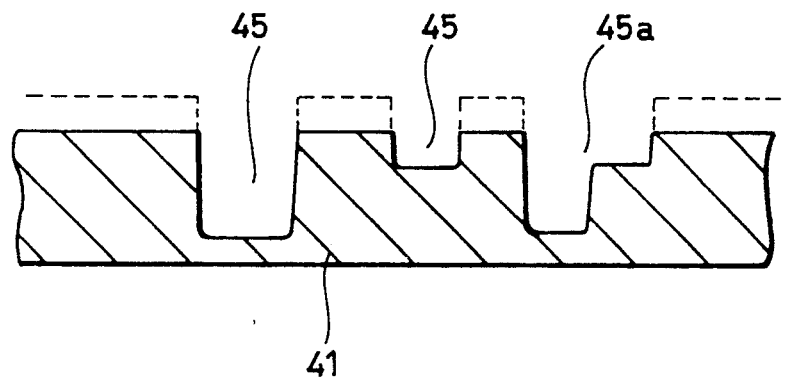
FIG. 16 is a sectional view showing the base material after working is completed in the eighth embodiment.

The laser beam 43, for example, under the conditions of the order of output: 100 W, scanning rate: 1 m/min, scanning pitch: 100 μm, works the base material to the depth of about 1 mm. The width to be worked is obtained in accordance with the equation: scanning pitch (100 μm) × the number of operation + beam diameter (about 200 μm). Then, the base material is etched in an aqueous solution of phosphoric acid of 85% at 200° C. for 20 minutes, with an ultrasonic vibration of 47 kHz being applied. Then, when the resist on the surface is peeled with a remover or the like, the base material 41 can be obtained having desired worked portions 45, 45a as shown in FIG. 16.

It has become easier to etch the affected portion formed in the base material 41 than to etch the base material, so that a condition which is softer than a conventional photoetching can be adopted. In addition, as the surface of the ceramic base material 41 is protected by the resist film 42, the surface of the base material is not damaged by etching at a temperature higher than the working temperature (180° C.) in the sixth embodiment. Etching at a higher temperature makes it possible to work in a shorter working time. A similar effect may be obtained by applying a thermal shock in place of applying a vibration during etching.

The shape and the depth of the affected portion can be controlled by changing at least one of the beam output, the beam scanning rate, the scanning pitch and the number of scanning. For example, it is also possible to form a terraced portion as the affected portion 44a shown in FIG. 16. Deeper holes and grooves can be easily formed by control of the beam.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of working a base material which essentially consists of ceramic material, comprising:

an irradiation process of irradiating said base material with an energy beam, said irradiating forming an affected portion having cracks therein in said base material; and a removing process for removing said affected portion by expanding and extending said cracks.

2. The method according to claim 1, wherein said base material includes an oxide ceramic material.

3. The method according to claim 1, wherein said irradiation process includes a process of irradiating a laser beam.

4. The method according to claim 1, wherein said irradiation process includes a process of irradiating an electron beam.

5. The method according to claim 1, wherein said irradiation process includes a process of scanning the energy beam.

6. The method according to claim 1, wherein said removing process includes a process of removing said affected portion by vibrating said base material to expand and extend said cracks.

7. The method according to claim 6, wherein said removing process includes a process of applying ultrasonic vibration to said base material.

8. The method according to claim 1, wherein said removing process includes a process of removing said affected portion by applying a thermal shock to said base material to expand and extend said cracks.

9. The method according to claim 8, wherein said removing process includes a process of heating and then cooling said base material.

10. The method according to claim 1, wherein said removing process includes a process of removing said affected portion by putting said affected portion in contact with an etching solution to expand and extend said cracks.

11. The method according to claim 1, wherein the base material used in the irradiation process is a base material on which a resist film is formed.

12. The method according to claim 10, wherein said removing process includes a process of vibrating and etching said base material at the same time.

13. The method according to claim 10, wherein said removing process includes a process of etching the affected portion to expand and extend said cracks and further extending and expanding said cracks by a thermal shock.

14. The method according to claim 10, wherein said removing process includes a process of etching the affected portion having the cracks therein, said cracks being further extended and expanded by vibration.

15. The method according to claim 10, wherein the base material used in the irradiation process is a base material on which a resist film is formed.

16. A method of working a base material which essentially consists of a ceramic material, comprising:

irradiating an energy beam on said base material in order to form an affected portion having cracks in said base material; and removing said affected portion, including vibrating said base material to expand and extend said cracks.

17. The method according to claim 16 wherein said step of removing includes applying ultrasonic vibration to said base material.

18. A method of working a base material which essentially consists of a ceramic material, comprising:

irradiating an energy beam on said base material to form an affected portion having cracks in said base material; and removing said affected portion, including applying a thermal shock to said base material to expand and extend said cracks.

19. The method according to claim 18, wherein said step for removing includes heating and then cooling said base material.

20. A method of working a base material which essentially consists of a ceramic material, comprising:

irradiating an energy beam on said base material to form an affected portion having cracks in said base material; and removing said affected portion, including vibrating and etching said base material at the same time.

21. A method of working a base material which essentially consists of a ceramic material, comprising:

irradiating an energy beam on said base material to form an affected portion having cracks in said base material; and removing said affected portion by etching said affected portion and applying a thermal shock to said base material to extend and expand said cracks.

22. A method of working a base material which essentially consists of a ceramic material, comprising:

irradiating an energy beam on said base material to form an affected portion having cracks in said base material; and removing said affected portion by etching the affected portion having the cracks therein extended and expanded by vibration.

* * * * *